United States Patent
Yang

(10) Patent No.: US 7,542,195 B2
(45) Date of Patent: Jun. 2, 2009

(54) TRIPLE ALIGNMENT SUBSTRATE METHOD AND STRUCTURE FOR PACKAGING DEVICES

(75) Inventor: Xiao Yang, Cupertino, CA (US)

(73) Assignee: Miradia Inc., Sunnyvale, CA (US)

( * ) Notice: Subject to any disclaimer, the term of this patent is extended or adjusted under 35 U.S.C. 154(b) by 0 days.

(21) Appl. No.: 12/033,718

(22) Filed: Feb. 19, 2008

(65) Prior Publication Data

US 2008/0138957 A1    Jun. 12, 2008

Related U.S. Application Data

(62) Division of application No. 11/142,561, filed on May 31, 2005, now Pat. No. 7,349,140.

(51) Int. Cl.
*G02F 1/03* (2006.01)
*H01L 21/46* (2006.01)

(52) U.S. Cl. .................. 359/254; 359/321; 257/797; 438/455; 438/462

(58) Field of Classification Search .......... 359/237, 359/245–255, 259, 315–317, 321; 257/717, 257/797, 900; 438/267, 400, 401, 455, 462; 349/155
See application file for complete search history.

(56) References Cited

U.S. PATENT DOCUMENTS

| | | | |
|---|---|---|---|
| 3,997,964 A | 12/1976 | Holbrook et al. | |
| 5,457,022 A | 10/1995 | Hioki et al. | |
| 5,828,434 A * | 10/1998 | Koden et al. | 349/148 |
| 6,084,288 A | 7/2000 | Farnworth et al. | |
| 6,093,623 A | 7/2000 | Forbes | |
| 6,294,439 B1 | 9/2001 | Sasaki et al. | |
| 6,396,711 B1 | 5/2002 | Degani et al. | |
| 6,417,075 B1 | 7/2002 | Haberger et al. | |
| 6,514,789 B2 | 2/2003 | Denton et al. | |
| 6,562,658 B2 | 5/2003 | Ohuchi et al. | |
| 6,566,745 B1 | 5/2003 | Byene | |
| 6,639,313 B1 | 10/2003 | Martin et al. | |
| 6,653,210 B2 | 11/2003 | Choo et al. | |
| 6,664,503 B1 | 12/2003 | Hsieh et al. | |
| 6,764,875 B2 | 7/2004 | Shook | |

(Continued)

FOREIGN PATENT DOCUMENTS

| | | |
|---|---|---|
| WO | WO 01/29890 A2 | 4/2001 |
| WO | WO 03/054927 A2 | 7/2003 |
| WO | WO 2004/099065 A1 | 11/2004 |

*Primary Examiner*—Huy K Mai
(74) *Attorney, Agent, or Firm*—Townsend and Townsend and Crew LLP

(57) ABSTRACT

A method for aligning multiple substrates. The method includes providing a handle substrate, providing a spacer substrate, and forming a plurality of first alignment marks on a first surface of the handle substrate. The method also includes forming a plurality of self-limiting alignment marks on a first surface of the spacer substrate and forming a plurality of openings in the spacer substrate, each of the plurality of openings surrounded by standoff regions. The method further includes aligning the first surface of the handle substrate and the first surface of the spacer substrate using the first alignment marks and the self-limiting alignment marks and bonding the handle substrate to the spacer substrate to form a composite substrate structure. In a specific embodiment, the plurality of self-limiting alignment marks and the plurality of openings are formed using an anisotropic wet etching process that preferentially etches the spacer substrate.

14 Claims, 7 Drawing Sheets

U.S. PATENT DOCUMENTS

| | | |
|---|---|---|
| 6,822,326 B2 | 11/2004 | Enquist et al. |
| 6,856,014 B1 | 2/2005 | Ehmke et al. |
| 7,118,234 B2 | 10/2006 | Pan et al. |
| 7,172,921 B2 | 2/2007 | Yang et al. |
| 7,286,278 B2 | 10/2007 | Patel et al. |
| 7,303,645 B2 | 12/2007 | Yang et al. |
| 7,359,015 B1 * | 4/2008 | Wang et al. .................. 349/114 |
| 2002/0181838 A1 | 12/2002 | Cunningham et al. |
| 2002/0191141 A1 * | 12/2002 | Liao ........................... 349/155 |
| 2003/0025984 A1 | 2/2003 | Gudeman et al. |
| 2003/0104651 A1 | 6/2003 | Kim et al. |
| 2004/0028875 A1 | 2/2004 | Van Rijn et al. |
| 2004/0087053 A1 | 5/2004 | Lytle et al. |
| 2004/0219764 A1 | 11/2004 | Syllaios et al. |
| 2005/0012228 A1 * | 1/2005 | Hiramatsu et al. .......... 257/797 |
| 2005/0233546 A1 | 10/2005 | Oohata et al. |

\* cited by examiner

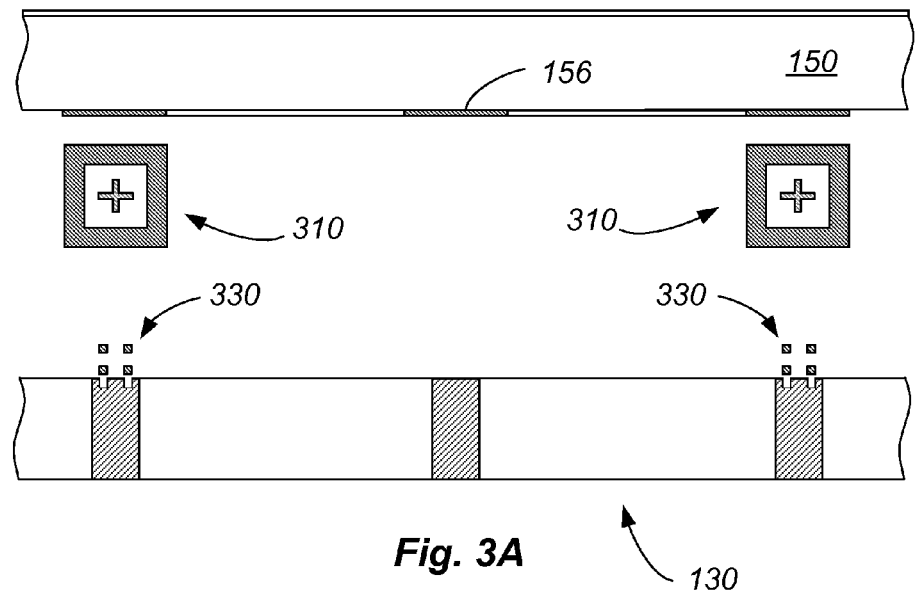
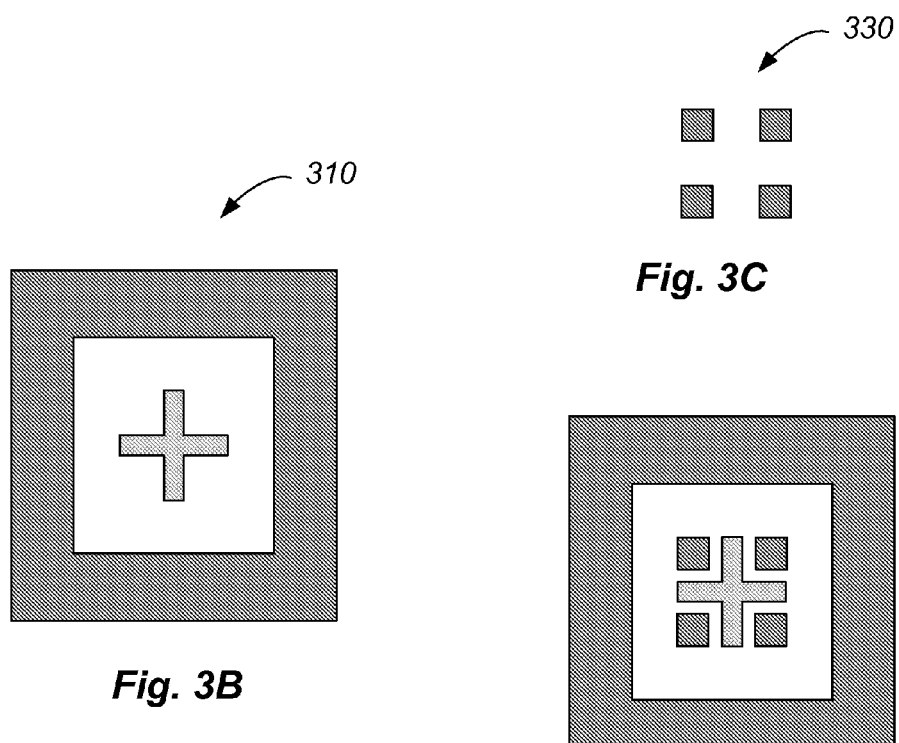
Fig. 3A
Fig. 3B
Fig. 3C
Fig. 3D

TRIPLE ALIGNMENT SUBSTRATE METHOD AND STRUCTURE FOR PACKAGING DEVICES

CROSS-REFERENCES TO RELATED APPLICATIONS

This application is a division of U.S. patent application Ser. No. 11/142,561, filed on May 31, 2005, the disclosure of which is hereby incorporated by reference in its entirety.

BACKGROUND OF THE INVENTION

The present invention relates generally to packaging techniques. More particularly, the invention includes a method and structure for aligning and packaging optical devices. Merely by way of example, the invention has been applied to the alignment and bonding of substrates to form a composite substrate package. But it would be recognized that the invention has a much broader range of applicability.

Visual display technologies have rapidly developed over the years. Most particularly, electronic displays for outputting television shows, streaming video, and the like. From the early days, cathode ray tube technology, commonly called CRTs, outputted selected pixel elements onto a glass screen in conventional television sets. These television sets originally output black and white moving pictures. Color television sets soon replaced most if not all black and white television units. Although very successful, CRTs were often bulky, difficult to make larger, and had other limitations.

CRTs were soon replaced, at least in part, with liquid crystal panel displays. These liquid crystal panel displays commonly called LCDs used an array of transistor elements coupled to a liquid crystal material and color filter to output moving pictures in color. Many computer terminals and smaller display devices often relied upon LCDs to output video, text, and other visual features. Unfortunately, liquid crystal panels often had low yields and were difficult to scale up to larger sizes. These LCDs were often unsuitable for larger displays often required for television sets and the like.

Accordingly, projection display units have been developed. These projection display units include, among others, a counterpart liquid crystal display, which outputs light from selected pixel elements through a lens to a larger display to create moving pictures, text, and other visual images. Another technology is called "Digital Light Processing" (DLP), which is a commercial name from Texas Instruments Incorporated (TI) of Texas, USA. DLP is often referred to as the use of "micro-mirrors." DLP relies upon a few hundred thousand tiny mirrors, which line up in 800 rows of 600 mirrors each. Each of the mirrors is hinged. An actuator is attached to each of the hinges. The actuator is often electrostatic energy that can tilt each of the mirrors at high frequency. The moving mirrors can modulate light, which can be transmitted through a lens and then displayed on a screen. Although DLP has been successful, it is often difficult to manufacture and subject to low yields, etc. DLP is also manufactured using (micro-electromechanical systems) MEMS based processing techniques. Such MEMS based processing technique is often costly and difficult to scale up for efficient processing. More specifically, packaging techniques used for MEMS are also difficult and costly to scale up.

From the above, it is seen that an improved technique for packaging devices is desired.

SUMMARY OF THE INVENTION

According to the present invention, techniques for packaging devices are provided. More particularly, the invention includes a method and structure for aligning and packaging optical devices. Merely by way of example, the invention has been applied to the alignment and bonding of substrates to form a composite substrate package. But it would be recognized that the invention has a much broader range of applicability.

In a specific embodiment of the present invention, a method for aligning multiple substrates is provided. The method includes providing a handle substrate and providing a spacer substrate. The method further includes forming a plurality of first alignment marks on a first surface of the handle substrate, forming a plurality of self-limiting alignment marks on a first surface of the spacer substrate, and forming a plurality of openings in the spacer substrate, each of the plurality of openings surrounded by standoff regions. The method also includes aligning the first surface of the handle substrate and the first surface of the spacer substrate using the first alignment marks and the self-limiting alignment marks and bonding the handle substrate to the spacer substrate to form a composite substrate structure.

In another embodiment of the present invention, the method further comprises providing a device substrate and forming a plurality of second alignment marks on a device surface of the device substrate. Additionally, the method further comprises aligning the device substrate to the composite substrate structure using the first alignment marks, the self-limiting alignment marks, and the second alignment marks and bonding the device substrate to the composite substrate structure.

In another specific embodiment of the present invention, a method for forming a composite substrate structure is provided. The method includes providing a handle substrate, a spacer substrate and a device substrate. The method also includes forming a plurality of first alignment marks on a first surface of the handle substrate, forming a plurality of self-limiting alignment marks on a first surface of the spacer substrate, forming a plurality of openings extending through the spacer substrate, a first set of openings surrounded by standoff regions and a second set of openings defining view windows, and forming a plurality of second alignment marks on a device surface of the device substrate. The method further includes aligning the first surface of the handle substrate and the first surface of the spacer substrate using the first alignment marks and the self-limiting alignment marks, aligning the device surface of the spacer substrate and the device surface of the device substrate using the view windows and the second alignment marks, and bonding the handle substrate to the spacer substrate and the spacer substrate to the device substrate to form a composite substrate structure.

In yet another embodiment of the present invention, a spatial light modulator package is provided. The package includes a transparent substrate comprising an incident light surface and a face surface and a patterned spacer substrate comprising a spacer face region and a spacer device region, the patterned spacer substrate patterned to form a grid of standoff regions extending from the spacer face region to the spacer device region with a plurality of openings bordered by the grid of standoff regions. The spatial light modulator package also includes a plurality of first alignment marks on the face surface region of the transparent substrate and a plurality of self-limiting alignment marks on the spacer face regions of the standoff regions and aligned with the plurality of first alignment marks. The spatial light modulator package further includes a bond interface formed between the face surface of the transparent substrate and the spacer face regions of the standoff regions, a device substrate comprising a device surface region and a backside surface region, and a plurality of second alignment marks on the device substrate. The spatial light modulator package additionally includes a bond interface formed between the spacer device regions and the device surface of the device substrate, and a plurality of spatial light modulators coupled to the device surface of the device substrate, each of the plurality of spatial light modulators aligned with one of the plurality of openings in the spacer substrate.

In an additional embodiment, a method of forming a bonded substrate structure is provided. The method includes providing a spacer substrate and a handle substrate. The method also includes forming a plurality of self-terminating alignment marks in a first region of the spacer substrate, simultaneously forming a plurality of windows in a second region of the spacer substrate, the plurality of windows passing through the spacer substrate, and using the plurality of alignment marks to align the spacer substrate to the handle substrate.

Many benefits are achieved by way of the present invention over conventional techniques. For example, the present technique provides an easy to use process that relies upon conventional technology. In some embodiments, the method provides higher device yields for the bonded substrates. Additionally, the method provides a process that is compatible with conventional process technology without substantial modifications to conventional equipment and processes. Preferably, the invention provides for an improved integrated structure including integrated circuits and mirror structures for display applications. In preferred embodiments, the present method provides a batch process, which can produce high throughput and yields.

Additionally, embodiments of the present invention provide improved alignment accuracy because the alignment marks are located in the same focal plane. When alignment marks are placed at the edge of a substrate, i.e., global marks, the number of alignment marks in one embodiment is reduced, resulting in improved accuracy. Moreover, some embodiments of the present invention provide a single mask and etch step in fabricating a spacer structure that includes both a window region and multiple alignment marks. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIG. 3A is a simplified schematic cross-sectional diagram illustrating an alignment method according to an embodiment of the present invention.

FIGS. 3B-3D illustrate top views of alignment marks used in a particular embodiment of the present invention.

DETAILED DESCRIPTION OF THE INVENTION

According to the present invention, techniques for packaging devices are provided. More particularly, the invention includes a method and structure for aligning and packaging optical devices. Merely by way of example, the invention has been applied to the alignment and bonding of substrates to form a composite substrate package. But it would be recognized that the invention has a much broader range of applicability.

Figure 1:
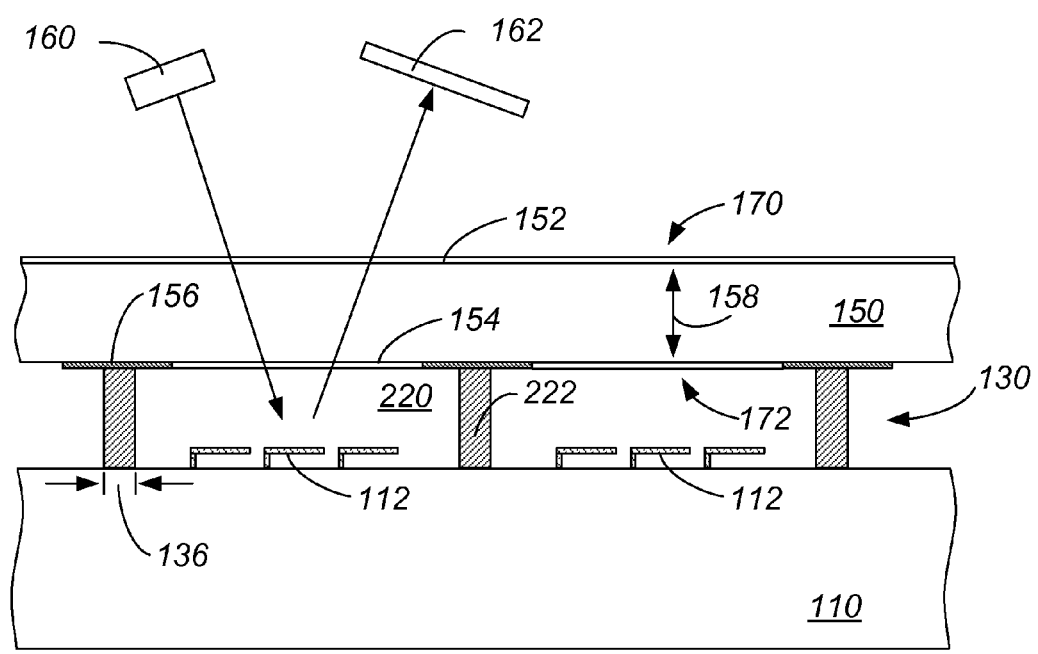
FIG. 1 is a simplified schematic cross-sectional diagram illustrating a composite substrate package according to an embodiment of the present invention.

FIG. 1 is a simplified schematic cross-sectional diagram illustrating a composite substrate package according to an embodiment of the present invention. As illustrated in FIG. 1, a device substrate 110, a spacer structure 130, and a handle substrate 150 are joined by a bonding process to form a composite substrate structure. In some embodiments, the handle substrate is a transparent substrate. In the embodiment illustrated in FIG. 1, a number of MEMS devices 112 are arrayed on a surface of the device substrate. In one embodiment, the MEMS devices includes an array of micro-mirrors arrayed to form a spatial light modulator. The following diagrams are merely examples, which should not unduly limit the scope of the claims herein. One of ordinary skill in the art would recognize many variations, alternatives, and modifications.

As illustrated in FIG. 1, light incident from light source 160 is transmitted through transparent handle substrate 150, which may include antireflection (AR) coatings 152 and 154 and light-blocking regions 156, and impinges on MEMS devices 112. In a specific embodiment, the MEMS devices are micro-mirrors arranged in a two-dimensional array and actuated by electrodes (not shown) coupled to the device surface of the device substrate, for example, a CMOS substrate. An example of a CMOS substrate and micro-mirrors according to embodiments of the present invention is described in U.S. patent application Ser. No. 10/756,936, filed Jan. 13, 2004; now U.S. Pat. No. 7,118,234, commonly owned, and hereby incorporated by reference for all purposes. Light reflected from the MEMS devices passes back through the transparent substrate to a viewing screen 162. Selective modulation of micro-mirror reflectivity produces a desired image on the viewing screen in a particular embodiment of the present invention.

In some embodiments of the present invention, the CMOS substrate surface is prepared in order to provide bonding surfaces on the device face of the CMOS substrate. One example of such methods and structures compatible with wafer bonding of substrates is described in co-pending and commonly owned U.S. patent application Ser. No. 11/028, 946, filed Jan. 3, 2005; now U.S. Pat. No. 7,172,921, which is incorporated by reference for all purposes.

In one embodiment, after formation of CMOS circuitry, including electrodes, a layer of a first thickness is deposited on the device substrate. In a particular embodiment, the deposited layer is a silicon dioxide ($SiO_2$) layer, but this is not required by the present invention. Other suitable materials may be used within the scope of the present invention. For example, the deposited layer is formed by deposition of silicon nitride ($Si_3N_4$), silicon oxynitride (SiON), or polysilicon layers, including amorphous polysilicon, in yet another alternative embodiment according to the present invention.

Generally, a chemical mechanical polishing (CMP) step is performed to planarize the upper surface of the deposited layer. The CMP process reduces the thickness of the deposited layer to a second thickness less than the first thickness, resulting in a highly polished and planarized layer. In a particular embodiment, the root-mean-square (RMS) roughness of the planarized surface is less than or equal to about 5 Å. As will be described below, the extremely smooth surface produced during the CMP process facilitates bonding of the spacer structure to the device substrate.

After the CMP step, a photolithography process is generally performed in which a photoresist layer is deposited and patterned to form an etch mask on surface of the polished deposited layer. The photolithography process is well known and as will be evident to one of ordinary skill in the art. In a specific embodiment, an etch mask of metal such as Al or TiN is utilized to remove selected portions of the deposited layer to form bonding regions on the surface of the device substrate.

In some embodiments of the present invention, the processes used to deposit, pattern, and etch the deposited layer or layers from which the bonding regions are fabricated is performed at low temperatures. For example, these processing steps may be performed with a view to the structures present on the device substrate prior to the formation of the bonding regions, such as CMOS circuitry. Since some CMOS circuitry may be adversely impacted by performing high temperature deposition processes, which may damage metals coupling CMOS transistors or result in diffusion of junctions associated with the CMOS circuitry, low temperature deposition processes are utilized according to some embodiments of the present invention. Moreover, in a particular embodiment of the present invention, low temperature deposition, patterning, and etching processes, such as processes performed at temperatures of less than 500° C., are used to form the layer or layers from which the bonding regions are fabricated. In another specific embodiment, deposition, patterning, and etching processes performed at less than 400° C., are used to form the layer from which the bonding regions are fabricated. One of ordinary skill in the art would recognize many variations, modifications, and alternatives within the scope of low temperature processes.

Figure 2:
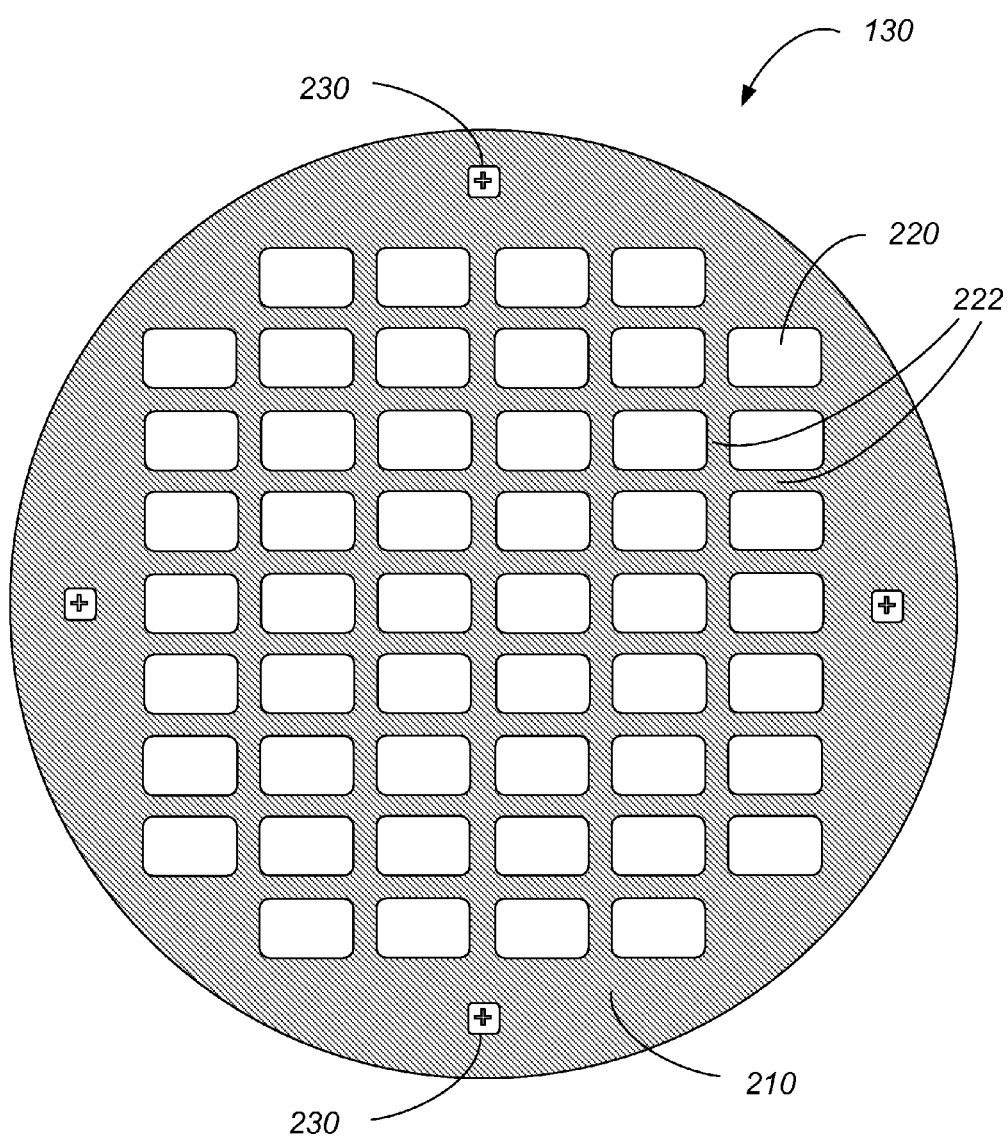
FIG. 2 is a simplified top-view illustration of a spacer structure according to an embodiment of the present invention.

As further illustrated in FIGS. 1 and 2, a spacer structure 130 is provided. FIG. 2 is a simplified top-view illustration of a spacer structure according to an embodiment of the present invention. As shown, the present invention provides a method for forming a spacer structure for packaging devices, e.g., optical devices, integrated circuits, and/or MEMS, in which a device layer is maintained at a selected distance from other layers of a package. Referring to FIG. 2, the method includes providing a substrate 210, e.g., a silicon wafer or a silicon on insulator substrate. The substrate includes a face surface region facing the transparent substrate, a device surface region facing the device substrate, and a thickness defined between the face surface region and the device surface region. The method forms a plurality of window openings 220 through the thickness of the substrate to provide a resulting patterned substrate 130. Each of the window openings is bordered by a portion of the selected portions of the face surface region. As will be described more fully below, the substrate 210 is used to fabricate a spacer structure including standoff regions that are used to provide a physical cavity for a number of devices.

The spacer structure illustrated in FIG. 1 includes a number of open regions or windows 220 bounded by standoff regions 222. As illustrated in FIG. 2, a number of generally rectangular windows 220 are bounded on all sides by standoff regions 222 arrayed in horizontal and vertical directions. As illustrated in FIGS. 1 and 2, each of the windows 220 are positioned to align with an array of MEMS devices. The generally rectangular shape of the windows illustrated in FIG. 2 enables the MEMS devices to be arrayed, in a specific embodiment of the present invention, in a rectangular two-dimensional array of 1,920 mirrors by 1,080 mirrors, each mirror being 15 μm on a side. Moreover, in alternative embodiments, other numbers of mirrors of differing size are utilized.

Alignment marks 230 are provided on the spacer structure for use in aligning the spacer structure to other substrates. For example, as illustrated in FIG. 1, it is preferable to align the AR coated portions 154 of the transparent substrate with the windows 220 and the MEMS devices present on the device surface of the device substrate. Accordingly, alignment marks 230, along with complementary alignment marks on the transparent substrate and the device substrate, are utilized in positioning the three substrates with respect to each other. As described more fully below, additional alignment marks (not shown in FIG. 2) may be formed on the spacer structure to aid in aligning the spacer structure to the device substrate and transparent substrate.

Merely by way of example, some of the alignment marks present on the spacer structure may be alignment marks visible through corresponding alignment marks on the transparent substrate. Moreover, an additional number of alignment marks present on the spacer structure may provide view windows extending through the thickness of the spacer structure, enabling an operator to image through the spacer structure to align the spacer structure with an underlying substrate (e.g., a device substrate including a number of MEMS devices). Although alignment marks 230 as illustrated in FIG. 2 are located at four positions adjacent the periphery of the spacer structure, this is not required by the present invention. In alternative embodiments, the location, size, geometry, and number of alignment marks is varied depending on the particular application. One of ordinary skill in the art would recognize many variations, modifications, and alternatives.

The spacer structure 130 is fabricated from materials characterized by suitable durability, rigidity, and selected thermal properties. For example, in one embodiment, the spacer structure is fabricated from a silicon substrate 725 μm thick. In alternative embodiments, the spacer structure is a compound silicon-on-insulator (SOI) substrate including a silicon layer sandwiched between silicon oxide insulating layers. Openings 220 are typically formed using a masking and etching process, although this is not required by the present invention. In other embodiments, the openings are formed by grit blasting, ion milling, or other suitable methods.

As illustrated in FIG. 1, the width 136 of the standoff regions is a predetermined width. In one embodiment, the width of the standoff regions, measured (with respect to FIG. 2) in both horizontal and vertical directions at center points of the windows 220, is uniform and equal to 1.0 mm. In alternative embodiments, the width varies from about 0.1 mm to about 10 mm. In yet other embodiments, the width of the standoff regions differs in the horizontal and vertical directions as appropriate to a particular application.

A handle substrate 150 is also illustrated in FIG. 1. Generally, the handle substrate is transparent to visible radiation. In the embodiment illustrated in FIG. 1, the handle substrate 150 has a predetermined thickness 158 measured between an incident light surface 170 and a face surface 172. In an embodiment according to the present invention, the thickness of the handle substrate is 1.1 mm. Alternatively, the thickness ranges from about 0.7 mm to about 3.0 mm in other embodiments. Of course, the thickness will depend upon the particular applications. Additional description of one transparent substrate is found in described in co-pending and commonly owned U.S. patent application Ser. No. 10/693,323, filed Oct. 24, 2003; now U.S. Pat. No. 7,303,645, which is incorporated by reference for all purposes.

As illustrated in FIG. 1, in addition to antireflection (AR) coatings 152 and 154 on the incident light and face surfaces of the handle substrate, respectively, light-blocking regions 156 are placed on selected portions of the face surface of the handle substrate. In one embodiment, the light-blocking regions are fabricated by depositing a suitable light-blocking material on predetermined portions of a transparent substrate. In a specific embodiment, the light-blocking material is black chrome. As is well known to one of ordinary skill in the art, chromium plating or chrome is used in a variety of applications. Chrome coatings may be doped with light absorbing materials to produce a "black" or absorbing spectral profile. These or other suitable light-blocking coatings are provided by embodiments of the present invention. One of ordinary skill in the art would recognize many variations, modifications, and alternatives.

Hermetic sealing of the handle substrate to the spacer structure and the spacer structure to the device substrate is performed according to several methods well known to those skilled in the art. For example, in an embodiment according to the present invention, hermetic sealing is performed by plasma activated covalent wafer bonding (PACWB). PACWB is performed at room temperature after the device substrate, the spacer structure, and the handle substrate have been cleaned, for example, in SC1 ($NH_3:H_2O_2:H_2O$, 1:4:20) at 60° C., rinsed in de-ionized (DI) water, dipped in 2% HF for 20 seconds, rinsed in DI water and dried with $N_2$ or air. The device substrate, the spacer structure, and the handle substrate are then exposed, for example, to an oxygen plasma in a reactive ion etcher at a chamber pressure of about 35 mTorr.

In some embodiments according to the present invention, each of the faces being bonded to each other is subjected to a pre-bond treatment. The pre-bond treatment can include a cleaning and/or activation process of surfaces to be bonded to each other. The cleaning process can include conventional cleans such as those commonly called "RCA" cleans, among plasma activated cleaning and/or treatment processes. For example, in one embodiment, the device substrate, the spacer structure, and the handle substrate are exposed to an argon plasma. In this embodiment, after plasma treatment, the surfaces are hydrophilic, promoting bonding.

Bonding occurs via hermetic bonding techniques or non-hermetic bonding techniques or combinations of these, depending upon the specific embodiment. The hermetic techniques include, among others, anodic, eutectic, fusion, covalent, glass frit, etc. The non-hermetic techniques including, among others, epoxy and glue layers. Of course, one of ordinary skill in the art would recognize many other variations, modifications, and alternatives. In a specific embodiment, the device substrate, the spacer structure, and the handle substrate are brought into contact at room temperature in a preselected ambient environment. In alternative embodiments according to the present invention, other bonding techniques are used, for example, eutectic low temperature bonding and anodic bonding. In some embodiments according the present invention, the presence of the layers comprising glue material at the hermetically sealed interfaces improves the quality and reliability of the hermetic seal formed at these interfaces.

In an embodiment according to the present invention, the hermetic sealing process illustrated in FIG. 1 is performed in an environment comprising inert gases. Examples of inert gases are $N_2$ and Ar, among others. The benefits provided by hermetic sealing in an inert environment include, but are not limited to dampening of oscillations present in the devices and the prevention of electrical arcing. For example, if the devices are micro-mirrors arranged in an array, oscillations present during operation and motion of the micro-mirrors are damped and attenuated by the presence of the inert gas. Additionally, the possibility of electrical arcing between the elements of the micro-mirror array and/or the drive electronics is reduced by the presence of the inert gas.

Generally, one or more steps in the process of fabricating an integrated spatial light modulator involve the bonding of the substrates and structures illustrated in FIGS. 1 and 2 to form an integrated spatial light modulator package. Alignment of the substrates prior to and during the bonding process is controlled to align, for example, the areas adjacent the MEMS devices with the spacer structures and AR coatings 154 with the MEMS devices. In some embodiments, the use of silicon standoff regions limits the use of optical alignment techniques during the substrate bonding process due to the absorption characteristics of silicon in the visible region of the optical spectrum.

A method for packaging optical devices according to one embodiment of the present invention may be outlined as follows:

1. Provide a handle substrate (e.g., display grade glass panel) having an incident light surface region and a face surface region, a thickness of material defined between the incident light surface region and the face surface region;

2. Deposit AR coatings on the incident light surface region and first portions of the face surface region;

3. Deposit light-absorbing coatings on second portions of the face surface region;

4. Pattern the light-absorbing coatings on the second portions of the face surface region to form a number of first alignment marks;

5. Provide a standoff substrate (e.g., silicon wafer) having a standoff face region and a standoff device region, a thickness of material defined between the standoff face region and the standoff device region;

6. Protect first selected regions on the standoff face region using a first masking layer;

7. Protect the standoff device region using a second masking layer;

8. Expose the standoff substrate to an etching process to simultaneously form window regions extending through the thickness of the standoff substrate, the window regions surrounded by standoff regions, and self-limiting alignment marks on the standoff face region;

9. Remove the first masking layer;

10. Remove the second masking layer;

11. Align the first alignment marks with the self-limiting alignment marks;

12. Bond the face region of the handle substrate to the standoff face region;

13. Bond the standoff device region to a device region of a device substrate; and 14. Perform other steps, as desired.

The above sequence of steps provides a method for packaging an optical device according to an embodiment of the present invention. As shown, the method uses a combination of steps including a way of simultaneously forming self-limiting alignment marks and a plurality of standoff structures that form standoff regions to be bonded to a device substrate according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

FIG. 3A is a simplified schematic cross-sectional diagram illustrating an alignment method according to an embodiment of the present invention. FIGS. 3B-3D illustrate top views of alignment marks used in a particular embodiment of the present invention. As illustrated in FIG. 3, a portion of handle substrate 150 and spacer structure 130 are aligned prior to substrate bonding. A first portion of the selected black chrome apertures 156 has been removed to provide an alignment mark 310 in the face surface of the handle substrate. The alignment marks 310 are shown from a top-view in FIG. 3A as crosses below the actual location of the alignment mark. Thus, although the alignment marks 310 are actually formed in the plane of the face surface of the handle substrate, FIG. 3A provides a top-view illustration to aid in understanding the figures. As illustrated in FIG. 3A, alignment mark 310 is formed in the shape of a cross inside an open area, but this is not required by the present invention. Other embodiments utilize alignment marks of different geometries. Additionally, although FIG. 3A illustrates an alignment mark 310 positioned on every other black chrome aperture, this is not required by the present invention. Alternative embodiments utilize different numbers of alignment marks arrayed with different periodicities.

In one embodiment, the dimensions of the alignment mark are preselected for ease of use and accuracy in achieving predetermined alignment tolerances. For example, as illustrated in FIGS. 3A and 3B, the arms of alignment mark 310 are 100 μm wide and the height and width of the alignment mark are 100 μm.

Alignment marks 330 are also provided on spacer structure 130 as illustrated in FIGS. 3A and 3C. As before, the top-view of the alignment marks is provided adjacent the actual location of the alignment marks. Alignment marks 330 are etched into the face surface of the spacer structure using a dry etch process in one embodiment. In other embodiments, various techniques well known to one of skill in the art are utilized to form alignment marks 330. As illustrated in FIGS. 3A-3D, alignment marks 330 present on the face surface of the spacer structure are formed to cooperate with alignment marks 310 present on the face surface of the handle substrate. For example, in one embodiment, the width of the arms of the cross alignment mark 310 is preferably several microns smaller than the distance selected for the spacing between the squares of alignment mark 330. Accordingly, when aligned, the boundaries of features of the alignment marks on the spacer structure alternative enclose and are enclosed by the boundaries of the alignment marks on the handle substrate as illustrated in FIG. 3D. Merely by way of example, a cross with arms 25 μm in width aligned within four squares with a gap of 30 μm between squares will have spaces of 2.5 μm separating the respective inner and outer boundaries of the alignment marks. Moreover, the gap between the outer dimensions of alignment mark 330 and the inner dimensions of the square annular structure present in alignment mark 310 will generally be selected for ease of use and accuracy.

In some embodiments, the etching process used to form the alignment marks 330 in the spacer structure is terminated by selecting an etch time. In alternative embodiments, the etching process is terminated by selecting a combination of etch time and etch chemistry. However, in these embodiments, the line width and shape of the alignment marks may be impacted by undercutting and other etch process artifacts.

Figure 4A:
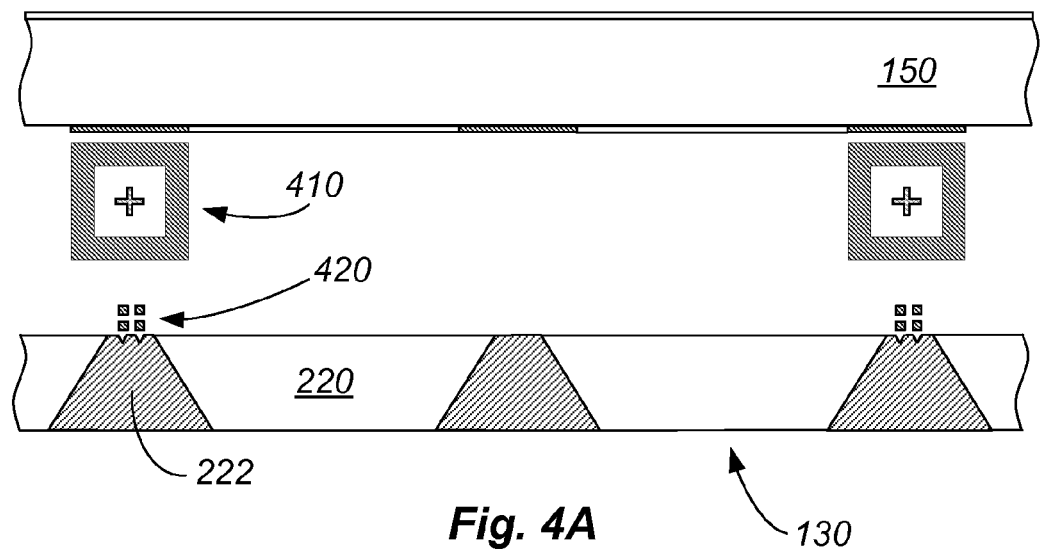
FIG. 4A is a simplified schematic cross-sectional diagram illustrating a method of forming alignment marks according to a specific embodiment of the present invention.

FIG. 4A is a simplified schematic cross-sectional diagram illustrating a method of forming alignment marks according to a specific embodiment of the present invention. As illustrated in FIG. 4A, alignment marks 410 are formed on the handle substrate 150 as described in reference to FIG. 3A. Additionally, alignment marks 420 are formed on the face surface of the spacer structure. In the embodiment illustrated in FIGS. 4A and 4B, the alignment marks 420 are formed by a wet etching process. In a particular embodiment, the alignment marks 420 are formed by a self-limiting wet etch process that terminates at a predetermined depth into the spacer structure.

Figure 4B:
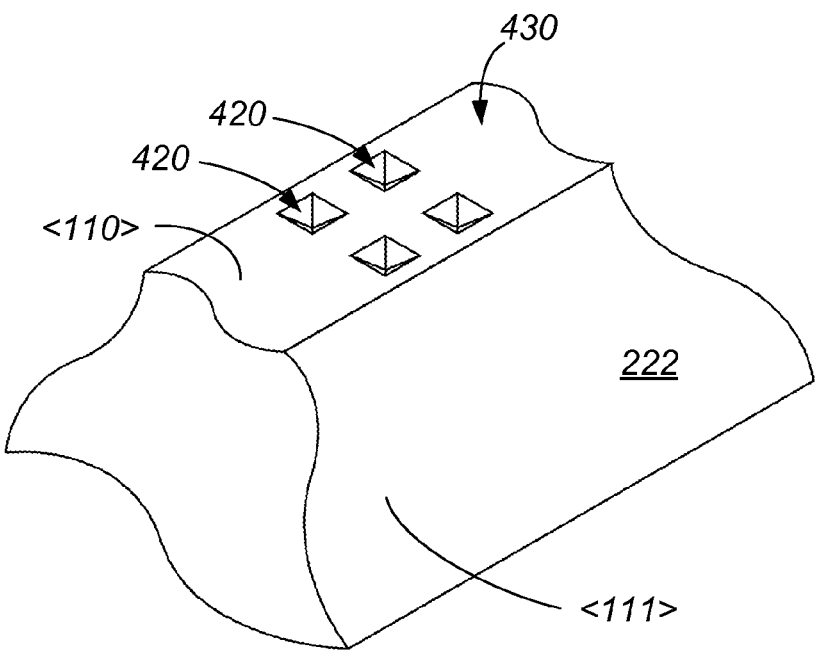
FIG. 4B is a simplified expanded perspective view of a standoff region and alignment marks according to an embodiment of the present invention.

FIG. 4B is a simplified expanded perspective view of a standoff region according to an embodiment of the present invention. In the embodiment illustrated in FIGS. 4A and 4B, the alignment marks 420 are formed in the face surface 430 of the standoff regions 222 simultaneously with the formation of windows 220 in the spacer structure. Preferably, an anisotropic wet etching process is utilized in which the etch rate is highly dependent on the silicon crystal lattice orientation. Merely by way of example, in one specific embodiment, the spacer structure is single crystal silicon and an anisotropic etching process is used that preferentially etches along the <111> crystal plane. A masking layer, for example, a hard mask fabricated using a silicon oxide or silicon nitride film, is deposited and patterned on the face surface 430 of the standoff regions and the spacer structure is exposed to a wet etchant solution, for example, a heated potassium hydroxide and water ($KOH/H_2O$) solution. Other etch chemistries, including tetramethylammonium hydroxide (TMAH) and ethylenediamene pyrocatecol (EDP), are utilized in other embodiments.

In anisotropic etching solutions, such as a $KOH/H_2O$ solution, silicon etches quickly in the <100> and <110> directions, but etches slowly in the <111> direction. Of course, the etch rates depend on several factors, including solution concentration and temperature, but for some solutions, the etch selectivity between the two crystal planes is a value equal to about 100. Accordingly, the mask pattern is transferred into the spacer structure in a self-limiting manner, terminating after the exposed <111> planes meet. As illustrated in FIG. 4B, the resulting alignment marks have a shape of an inverted pyramid with the base of the pyramid lying in the face surface 430 of the standoff regions 222. The width of the portion of the alignment mark measured in the face surface of the standoff region is correlated with the opening defined by the masking layer. In a preferred embodiment, the width of the alignment mark is equal to the opening defined by the masking layer with no undercutting.

Referring to FIG. 4A, in a specific embodiment according to the present invention, the alignment marks 420 are formed in the face surface of the standoff regions 222 simultaneously with the formation of windows 220 in the spacer structure. The timing of the wet etching process is selected to provide for etching through the entire spacer structure in the window regions. In a particular embodiment, the timing of the wet etching process is selected to minimize undercutting of the alignment marks while still permitting formation of the windows using a single step etching process.

A method for packaging optical devices according to an alternative embodiment of the present invention may be outlined as follows:

1. Provide a transparent substrate (e.g., transparent, display grade glass panel) having an incident light surface region and a face surface region, a thickness of material defined between the incident light surface region and the face surface region;

2. Deposit AR coatings on the incident light surface region and first portions of the face surface region;

3. Deposit light-absorbing coatings on second portions of the face surface region;

4. Pattern the light-absorbing coatings on the second portions of the face surface region to form a number of first alignment marks;

5. Provide a spacer substrate (e.g., silicon wafer) having a spacer face region and a spacer device region, a thickness of material defined between the spacer face region and the spacer device region;

6. Protect first selected regions on the spacer face region using a first masking layer;

7. Protect the spacer device region using a second masking layer;

8. Expose the spacer substrate to an etching process to simultaneously form window regions in the spacer substrate, the window regions surrounded by standoff regions, view window regions in the spacer substrate, and self-limiting alignment marks on the spacer face regions;

9. Remove the first masking layer;

10. Remove the second masking layer;

11. Align the first alignment marks with the self-limiting alignment marks;

12. Bond the face region of the handle substrate to the spacer face region;

13. Align the view window regions with alignment marks present on a device surface of a device substrate;

14. Bond the spacer device region to the device region of the device substrate; and 15. Perform other steps, as desired.

The above sequence of steps provides a method for packaging an optical device according to an alternative embodiment of the present invention. As shown, the method uses a combination of steps including a way of simultaneously forming self-limiting alignment marks and a number of silicon structures that form view windows for alignment and standoff regions to be bonded to a device substrate according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

Figure 5A:
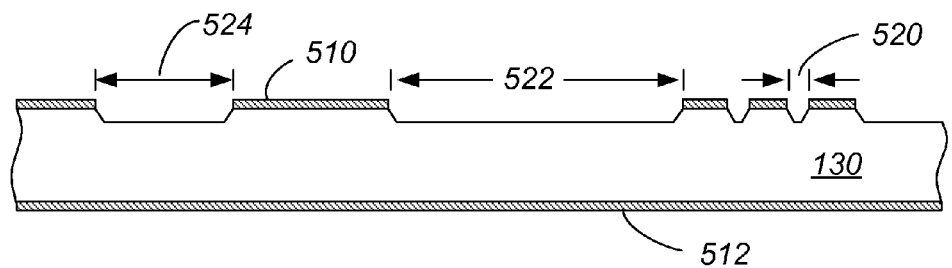
FIGS. 5A-5C are simplified schematic cross-sectional views of a spacer structure during three processing stages according to an embodiment of the present invention.
Figure 5B:
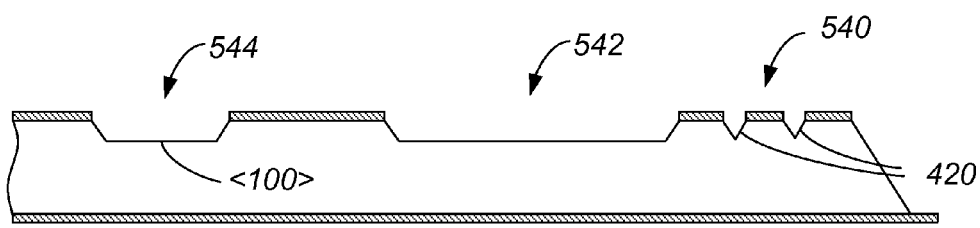
Figure 5C:
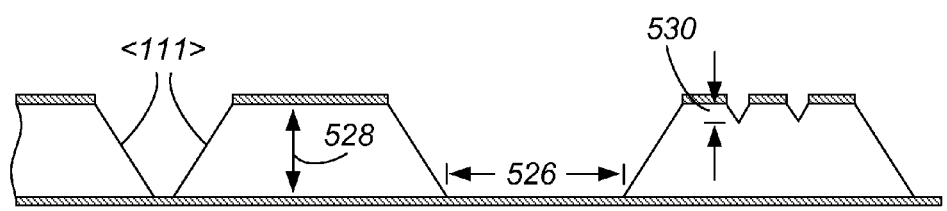

FIGS. 5A-5C are simplified schematic cross-sectional views of a spacer structure during three processing stages according to an embodiment of the present invention. These three figures illustrate the etching process at three different times during the overall etch process. As illustrated in FIG. 5A, masking layer 510 is deposited and patterned on the face surface of the spacer structure while leaving a plurality of unprotected regions. Additionally, masking layer 512 is deposited on the device surface of the spacer structure. Preferably, the masking layer is a hard mask made of silicon dioxide, silicon nitride, or a combination of these, among other materials. Preferably, each of the unprotected regions is associated with an opening either through the thickness of the substrate or through a partial thickness of the substrate.

The masking layer 510 is patterned to provide a first width 520 for formation of alignment marks 420, a second width 522, defining the width of the window measured in the plane of the face surface, and third width 524 defining the width of a view window measured in the plane of the face surface. Of course, the masking patterns are two-dimensional in the plane of the spacer structure. Because the <111> plane of silicon is oriented at an angle of 54.7° to the <100> plane, the widths and depths of the various etched features are related through simple trigonometric equations. For the alignment marks 420, the depth 530 of the alignment marks 420 is equal to ½ tan(54.7°)·W, where W is the width 520 of the alignment mark mask.

For the windows and view windows, the widths 522 and 524 are selected as a function of the thickness 528 of the spacer structure and the desired width of the appropriate window measured in the plane of the device surface. For example, if the width 522 of the mask opening measured in the face surface is set at 22.88 mm and the thickness 528 of the spacer structure is 700 μm, the width 526 of the window measured in the device surface will be equal to 16.2 mm (1,080 pixels at 15 μm center-to-center spacing). The dimension extending into the plane of the figure will be selected depending on the desired width of the window in this direction. Of course, the selected dimensions will depend on the particular application.

In FIG. 5A, the etching process is illustrated in an early stage of the wet etch process. The spacer structure has been removed in both the alignment mark 540, window 542, and view window 544 regions and is progressing into the spacer structure along the <111> planes of the silicon spacer structure. In FIG. 5B, the etching process has self-terminated in the alignment mark regions 540, but is continuing in the window region 542 and the view window region 544. In FIG. 5C, the etching process has removed the remainder of the material in the window region and the view window region. Thus, each of the window openings is bordered by standoff regions that are continuous from the face surface to the device surface of the spacer structure. Additionally, a number of view windows are provided at selected portions of the spacer structure.

As illustrated in FIG. 5C, no additional etching of the alignment marks 420 occur during the time transpiring between FIGS. 5B and 5C. Of course, any undercutting in the alignment mark regions may be incorporated into the process design. For example, given that the spacer structure is several hundred microns thick, and an etch selectivity equal to a value of about 100 for a particular solution, several microns of <111> plane material will be overetched in the alignment mark region. Of course, due to the orientation of the <111> and <100> planes, this will result in undercutting perpendicular to the <100> plane equal to a fraction of the thickness removed by overetching. As will be evident to one of skill in the art, the original mask design for the alignment marks, windows, and view windows may be designed to incorporate these second order effects.

The masking layers present on both surfaces of the spacer structure are removed after the alignment marks and respective windows are formed. Preferably, stripping or ashing occurs to remove the masking layer. One of ordinary skill in the art would recognize many variations, modifications, and alternatives. One method according to the present invention bonds the handle substrate to the finished spacer structure as illustrated in FIG. 6.

Figure 6:
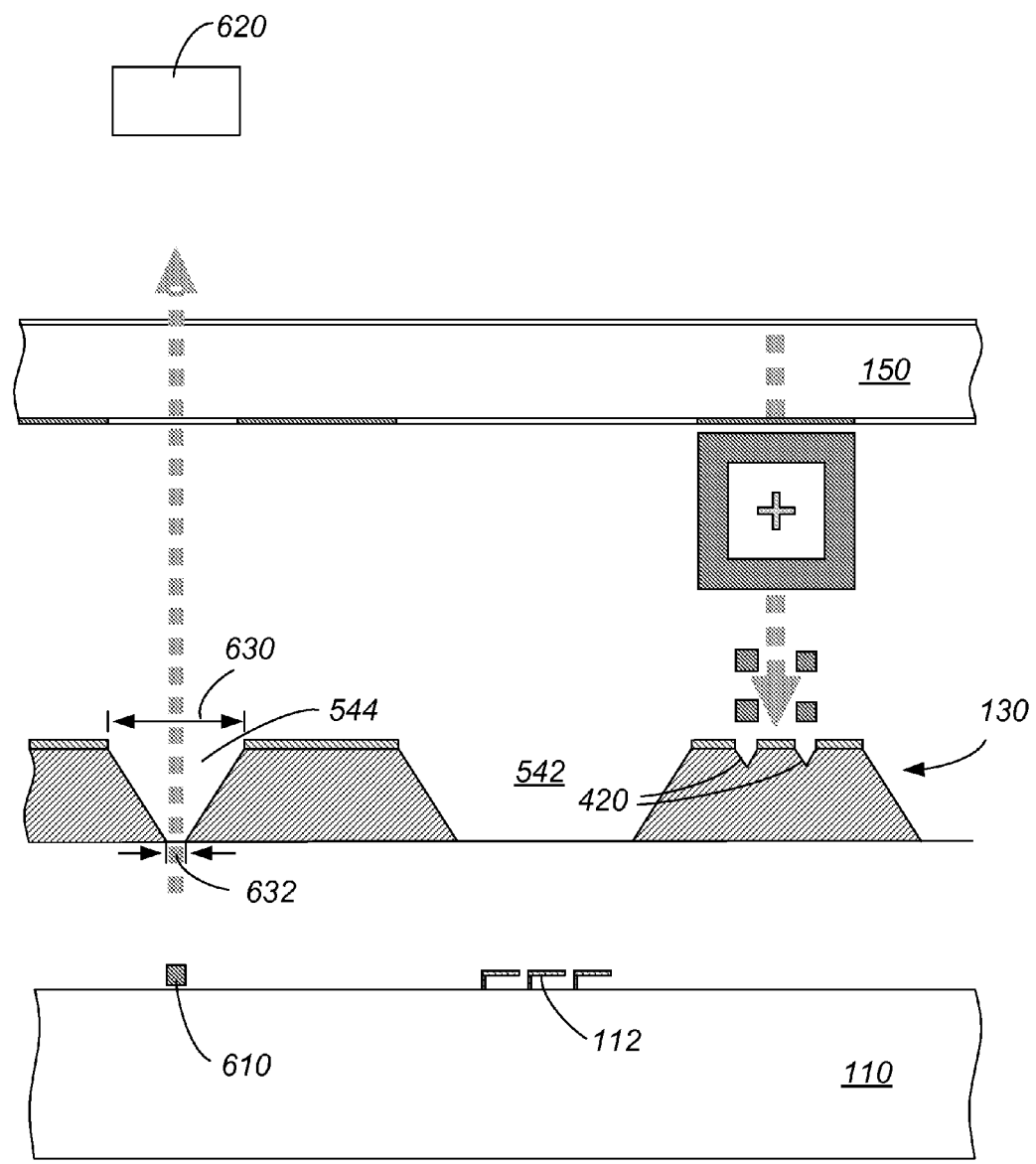
FIG. 6 is a simplified schematic cross-sectional diagram illustrating a method of aligning multiple substrates according to an embodiment of the present invention.

Referring to FIG. 6, a method for aligning multiple substrates is provided. As illustrated in FIG. 6, the handle substrate 150, for example, a transparent substrate, and the spacer structure 130 are aligned and bonded using the methods previously described. The alignment marks illustrated in FIGS. 2-4 are preferably used to align the substrates prior to bonding. In some embodiments, the handle substrate and the spacer structure are bonded together to form a hermetic seal at the bond interface.

View windows 544 fabricated simultaneously with the alignment marks 420 and window regions 542 are used in this embodiment to align a device substrate to the previously bonded handle substrate spacer structure composite structure. View windows 544 provide an optical path extending from an alignment mark 610 on the device surface of the device substrate through the spacer structure and the transparent handle substrate to a white light camera 620. Light propagating along this optical path passes in an uninterrupted manner from the alignment marks 610 to the white light camera, providing alignment information useful in aligning the spacer structure to the device substrate.

The three dimensional shape of the view windows 544 will be a function of the two-dimensional shape of the masking layer defined on the face surface of the spacer structure and the etch process. Some embodiments of the present invention define the view windows to correlate with the alignment marks present on the device substrate. In one particular embodiment, the masking layer is a square pattern with the length of the sides equal to W+twice the spacer structure thickness divided by tan(54.7°), where W is the width 632 of the square at the exit of the view window in the lower surface of the spacer structure. Thus, during the etching process, an inverted pyramid feature with a square base of width 630 is etched into the spacer structure, producing a square of width 632 in the device surface of the spacer structure. The width 632 of the square in the lower surface is generally selected to be slightly larger, for example, a few microns, than the outer dimensions of the alignment marks 610 present on the device substrate. In alternative embodiments, the masking pattern associated with the view windows is selected to form a two dimensional pattern in the device surface of the spacer structure, for example, a hollow cross or an annular cross inside a larger annular structure, after completion of the etching process. Complementary alignment marks 610 are provided in these alternative embodiments to cooperate with the view windows. One of ordinary skill in the art would recognize many variations, modifications, and alternatives.

As described above with reference to FIG. 5, any undercutting of the view window masking layer during the etching process may be accounted for in selecting the masking layer dimensions. Accordingly, the dimensions of the view window in the device surface of the spacer structure are controllably selected to correlate with the dimensions of the alignment mark 610 present on the device substrate. For example, the dimensions of the view window are selected to be several microns larger than the dimensions of the alignment mark, providing for precise alignment between the device substrate and the composite handle substrate/spacer structure on the micron scale. Bonding of the device substrate to the composite handle substrate/spacer structure is performed to form a triple substrate composite structure. In the embodiment illustrated in FIG. 6, the portion of the view window lying in the plane of the device face of the spacer structure and the alignment mark 610 are preferably located in substantially the same focal plane. Positioning the corresponding alignment marks adjacent to each other enables an alignment system with limited depth of focus to image both alignment marks simultaneously, facilitating the alignment process.

Alignment marks provided by a process such as that described with respect to FIGS. 4A to 4C, are used in some embodiments to align the handle substrate to the bonded structure including the spacer structure and the device substrate. Self limiting alignment marks 420 are aligned with alignment marks present on the face surface of the handle substrate as illustrated in FIG. 6. One of ordinary skill in the art would recognize many variations, modifications, and alternatives.

Figure 7:
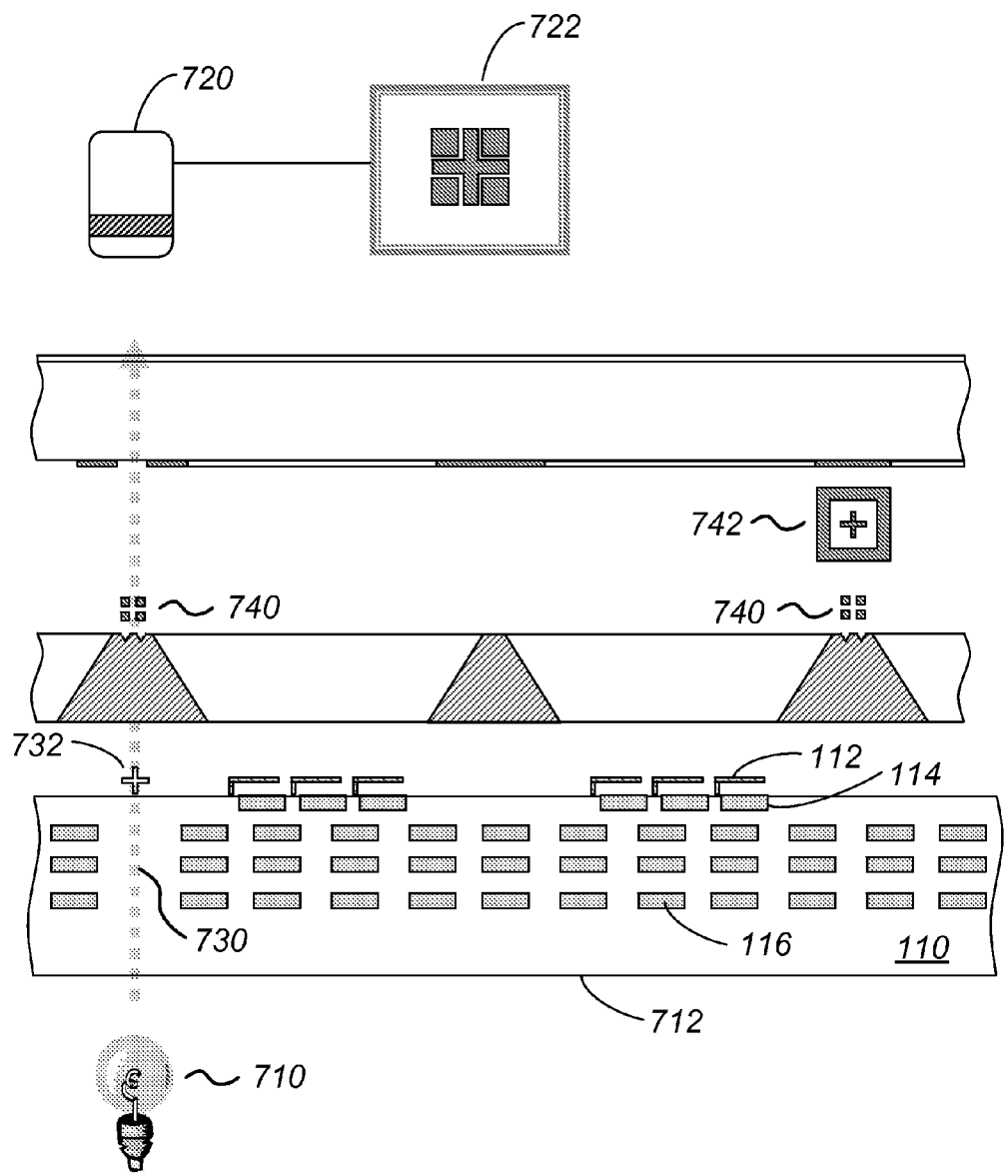
FIG. 7 is a simplified schematic cross-sectional diagram illustrating an alternative alignment method according to yet another embodiment of the present invention.

FIG. 7 is a simplified schematic cross-sectional diagram illustrating an alternative alignment method according to yet another embodiment of the present invention. In the embodiment illustrated in FIG. 7, an infrared light source 710 is provided and positioned adjacent the backside surface 712 of the device substrate. Because silicon has a bandgap of about 1.14 eV, the absorption coefficient for silicon drops rapidly at wavelengths longer than about 1100 nm. Thus, an infrared light source with an operating wavelength longer than about 1100 nm will propagate through silicon with minimal absorption. In embodiments of the present invention, the infrared light source is selected to provide for propagation of infrared radiation through both the device substrate and the spacer structure and detection of the infrared radiation at the infrared camera 720. An image as illustrated by screen shot 722 is produced by the infrared camera.

As illustrated in FIG. 7, a path 730 is located below the alignment marks 732 and passing through the device substrate. This path is an optical path in one embodiment and is maintained substantially free of device features during the processing of the device substrate. As illustrated in FIG. 7, the device substrate 110 includes a number of MEMS devices 112, electrodes 114, and associated drive circuitry 116. The path 730 provides an optical imaging path between the infrared light source and the alignment mark 732 formed on the device surface of the device substrate. Thus, radiation from the infrared light source is able to provide an illumination source for alignment mark 732 during a substrate alignment process. In some embodiments, maintaining path 730 substantially free of device features involves additional masking steps used to prevent the deposition or materials or to remove materials deposited in this region. Moreover, in alternative embodiments, the planarity of the device surface of the device substrate in the vicinity of path 730 is maintained through the use of additional masking and processing steps as will be evident to one of skill in the art.

As further illustrated in FIG. 7, alignment marks 740 on the face surface of the spacer structure are also utilized in aligning the device substrate to the composite handling substrate/spacer structure. Patterning and use of alignment marks 740 has been discussed previously with regard to FIGS. 4A-4C. In the embodiment illustrated in FIG. 7, the design of alignment marks 740 and 742 on the spacer structure and the handling substrate, respectively, is selected to correlate with the design of the alignment marks 732 on the device substrate. In one specific embodiment, the alignment marks 732 on the device substrate are patterned to include clear apertures larger than the alignment marks 740 and 742. Thus, infrared light passes through the device substrate and the clear apertures, providing an illuminated feature to which alignment marks 740 are aligned.

In the embodiment illustrated in FIG. 7, the use of view windows is not required, as the infrared light from infrared light source 710 is able to propagate through the device substrate and the spacer structure with minimal absorption. In some embodiments, the use of the alignment marks 732 simplifies the fabrication process for the composite substrate structure. Additionally, although the alignment of the handle substrate and the spacer structure was discussed with regard to an alignment process featuring imaging through the handle substrate, this is not required by the present invention. One of skill in the art will appreciate that the alignment of the handle substrate to the spacer structure may be performed using an infrared light source in a process featuring imaging through a spacer structure fabricated, for example, from silicon.

Alignment marks provided by a process such as that described with respect to FIGS. 4A to 4C, are used in some embodiments to align the handle substrate to the bonded structure including the spacer structure and the device substrate. Self limiting alignment marks 420 are aligned with alignment marks present on the face surface of the handle substrate as illustrated in FIG. 7. One of ordinary skill in the art would recognize many variations, modifications, and alternatives.

The above sequence of steps provides a method for packaging a optical device according to an embodiment of the present invention. As shown, the method uses a combination of steps including a way of forming a plurality of transparent and silicon structures that form a bonded structure including transparent windows, silicon standoff regions, and a device substrate according to an embodiment of the present invention. Other alternatives can also be provided where steps are added, one or more steps are removed, or one or more steps are provided in a different sequence without departing from the scope of the claims herein.

The examples and embodiments described herein are for illustrative purposes only. Various modifications or changes in light thereof will be suggested to persons skilled in the art and are to be included within the spirit and purview of this application and scope of the appended claims. It is not intended that the invention be limited, except as indicated by the appended claims.

What is claimed is:

1. A method of aligning multiple substrates, the method comprising:
   providing a handle substrate;
   providing a silicon spacer substrate,
   forming a plurality of first alignment marks on a first surface of the handle substrate;
   forming a plurality of self-limiting alignment marks on a first surface of the spacer substrate, the self-limiting alignment marks being formed using a wet etching process that preferentially etches the <100> and <110> planes of silicon at a faster rate than the <111> plane of silicon;
   forming a plurality of openings in the spacer substrate, each of the plurality of openings surrounded by standoff regions;
   aligning the first surface of the handle substrate and the first surface of the spacer substrate using the first alignment marks and the self-limiting alignment marks; and
   bonding the handle substrate to the spacer substrate to form a composite substrate structure.

2. The method of claim 1 wherein the plurality of self-limiting alignment marks and the plurality of openings are formed concurrently.

3. The method of claim 1 wherein a hermetic seal is formed during the step of bonding the handle substrate to the spacer substrate.

4. The method of claim 1 wherein the wet etching process comprises the use of solutions including one or more of KOH, TMAH, or EDP.

5. The method of claim 1 further comprising:
   providing a device substrate;
   forming a plurality of second alignment marks on a device surface of the device substrate;
   aligning the device substrate to the composite substrate structure using the first alignment marks, the self-limiting alignment marks, and the second alignment marks;
   bonding the device substrate to the composite substrate structure.

6. The method of claim 5 wherein an infrared detector is used to align the device substrate to the composite substrate structure.

7. A method of forming a composite substrate structure, the method comprising:
   providing a handle substrate, a silicon spacer substrate and a device substrate;
   forming a plurality of first alignment marks on a first surface of the handle substrate;
   forming a plurality of self-limiting alignment marks on a first surface of the spacer substrate, the self-limiting alignment marks being formed using a wet etching process that preferentially etches the <100> and <110> planes of silicon at a faster rate than the <111> plane of silicon;
   forming a plurality of openings extending through the spacer substrate, a first set of openings surrounded by standoff regions and a second set of openings defining view windows;
   forming a plurality of second alignment marks on a device surface of the device substrate;
   aligning the first surface of the handle substrate and the first surface of the spacer substrate using the first alignment marks and the self-limiting alignment marks;
   aligning the device surface of the spacer substrate and the device surface of the device substrate using the view windows and the second alignment marks; and
   bonding the handle substrate to the spacer substrate and the spacer substrate to the device substrate to form a composite substrate structure.

8. The method of claim 7 wherein a hermetic seal is formed at the face surface and the device surface during the substrate bonding steps.

9. The method of claim 7 wherein a wet etch process is used to form the plurality of openings extending through the spacer substrate.

10. The method of claim 9 wherein the plurality of self limiting alignment marks, the first set of openings surrounded by standoff regions, and the second set of openings defining view windows are formed concurrently.

11. The method of claim 7 wherein the wet etch process is an anisotropic etch process.

12. A method of forming a bonded substrate structure comprising a spacer substrate and a handle substrate, the method comprising:
   forming a plurality of self-terminating alignment marks in a first region of the spacer substrate, the self limiting alignment marks being formed using an anisotropic etch process that preferentially etches the <100> and <110> planes of silicon at a faster rate than the <111> plane of silicon;
   forming a plurality of windows in a second region of the spacer substrate, the plurality of windows passing through the spacer substrate; and
   aligning the spacer substrate to the handle substrate based in part on the plurality of alignment marks.

13. The method of claim 12 further comprising forming a plurality of view windows in a third region of the spacer substrate, the plurality of view windows passing through the spacer substrate.

14. The method of claim 12 further comprising bonding the handle substrate to the spacer substrate.

* * * * *